United States Patent [19]
Williams et al.

[11] Patent Number: 5,482,161
[45] Date of Patent: Jan. 9, 1996

[54] MECHANICAL INTERFACE WAFER CONTAINER

[75] Inventors: Randall S. Williams, Chaska; Nicholas T. Cheesebrow, St. Paul, both of Minn.

[73] Assignee: Fluoroware, Inc., Chaska, Minn.

[21] Appl. No.: 248,306

[22] Filed: May 24, 1994

[51] Int. Cl.$^6$ .............................. B65B 1/04; B65D 85/30
[52] U.S. Cl. ........................ 206/711; 141/98; 206/454; 220/323; 414/217; 414/292
[58] Field of Search .................................. 206/334, 454; 220/324, 326, 323; 141/98; 414/217, 292, 940; 118/500

[56] References Cited

U.S. PATENT DOCUMENTS

| | | | |
|---|---|---|---|
| 2,818,195 | 12/1957 | Scarlett | 220/323 X |
| 4,307,818 | 12/1981 | Singh et al. | 220/323 X |
| 4,532,970 | 8/1985 | Tullis et al. | |
| 4,534,389 | 8/1985 | Tullis . | |
| 4,582,219 | 4/1986 | Mortensen et al. | |
| 4,616,683 | 10/1986 | Tullis et al. | |
| 4,654,512 | 3/1987 | Gardosi . | |
| 4,674,936 | 6/1987 | Bonora . | |
| 4,674,939 | 6/1987 | Maney et al. | |
| 4,705,444 | 11/1987 | Tullis et al. | |
| 4,724,874 | 2/1988 | Parikh et al. | |
| 4,739,882 | 4/1988 | Parikh et al. | |
| 4,746,256 | 5/1988 | Boyle et al. | 414/217 |
| 4,815,912 | 3/1989 | Maney et al. | |
| 4,895,486 | 1/1990 | Baker et al. | |
| 4,995,430 | 2/1991 | Bonora et al. | 141/98 |
| 5,024,329 | 6/1991 | Grohrock | 206/454 |
| 5,123,681 | 6/1992 | Kos et al. | |
| 5,184,723 | 2/1993 | Karl et al. | |
| 5,248,033 | 9/1993 | Kos et al. | |
| 5,255,783 | 10/1993 | Goodman et al. | |

OTHER PUBLICATIONS

"SMIF and Its Impact On Cleanroom Automation" Shanti Gunawardena, Ulrich Kaempf, Barclay Tullis, John Vietor, Microcontamination. Sep. 1985.

*Primary Examiner*—Bryon P. Gehman
*Attorney, Agent, or Firm*—Palmatier, Sjoquist & Helget

[57] ABSTRACT

A standardized mechanical interface (SMIF) pod for use in conjunction with SMIF systems is disclosed. The pod is utilized for transporting article, such as semiconductor wafers or the like, between locations such as SMIF processing stations. The pod includes a box having an open end and a box door which sealably engages and closes the open end. The box contains a removable carrier which seats on the box door and which has an open side for insertion and removal of the articles. The pod features a latching mechanism in the box door utilizing a star wheel with tips that rotate and extend out of slots in the box door into slots in the interior sidewalls of the box. The tips then move vertically downward to sealingly engage the box door to the box. The star wheel embraces a concentric cammed hub having angled cam surfaces engaged by cam follower pins extending radially inward from the star wheel. The star wheel is configured and positioned in the box door such that partial rotation rotates the tips from the interior of the box to extend outwardly of the slots. At the point of extension a stop further limits the rotation of the star wheel causing the cam followers to follow the cam surface as the cammed hub is further rotated moving the star wheel downwardly, thus causing engagement of the tips with the slots in the box and moving the box door downwardly to sealingly engage the box door with the box. A pair of one-way valves provide for purging of the interior of the pod. An alignment arm swingably pivots from the top inside of the box. The alignment arm has an engagement finger that engages the top of the carrier and a retaining portion that extends in from of the open side of the carrier. As the wafer carrier with the box door is raised into the box the finger engages the top of the carrier to swing the retaining portion in front of the open side of the carrier to hold the wafers in place. The alignment arm swings by way of a flexible portion eliminating scraping or rubbing of parts.

25 Claims, 7 Drawing Sheets

MECHANICAL INTERFACE WAFER CONTAINER

BACKGROUND OF THE INVENTION

The present invention relates to standardized mechanical interface (SMIF) systems for reducing particle contamination in the processing of semiconductor wafers or the like. More particularly, the invention relates to a pod for use with SMIF systems.

The presence or generation of particles during the processing of integrated circuits can lead to physical defects or other quality control problem. Initially clean rooms were utilized to minimize particle contamination during processing. As the size of integrated circuitry has continued to be reduced the size of particles which can contaminate an integrated circuit has also become smaller making clean rooms impractical and overly expensive. Standard mechanical interface SMIF systems have gained popularity due to their inherent advantages in reducing and controlling particle contamination in the processing of wafers into integrated circuits.

In SMIF processing equipment, wafers to be processed are stored and transported in sealable boxes or pods. The pods typically have a removable box door that engages with an elevator door on a piece of SMIF processing equipment with the pod or box also interfacing with said equipment. The elevator door and the box door are opened simultaneously to prevent or minimize exposure of the wafers to any ambient air.

Of utmost importance is the retaining, sealing, and latching mechanisms associated with the pod or box. Retaining, latching and sealing mechanisms that utilize rubbing or scraping of parts can generate particles internally of the equipment. It is therefore important to utilize retaining, sealing, and latching mechanisms that eliminate or minimize the scraping or rubbing of surfaces.

SUMMARY OF THE INVENTION

A standardized mechanical interface (SMIF) pod for use in conjunction with SMIF systems is disclosed. The pod is utilized for transporting article, such as semiconductor wafers or the like, between locations such as SMIF processing stations. The pod includes a box having an open end and a box door which sealably engages and closes the open end. The box contains a removable carrier which seats on the box door and which has an open side for insertion and removal of the articles. The pod features a latching mechanism in the box door utilizing a star wheel with tips that rotate and extend out of slots in the box door into slots in the interior sidewalls of the box. The tips then move vertically downward to sealingly engage the box door to the box. The star wheel embraces a concentric cammed hub having angled cam surfaces engaged by cam follower pins extending radially inward from the star wheel. The star wheel is configured and positioned in the box door such that partial rotation rotates the tips from the interior of the box to extend outwardly of the slots. At the point of extension a stop further limits the rotation of the star wheel causing the cam followers to follow the cam surface as the cammed hub is further rotated moving the star wheel downwardly, thus causing engagement of the tips with the slots in the box and moving the box door downwardly to sealingly engage the box door with the box. A pair of one-way valves provide for purging of the interior of the pod. An alignment arm swingably pivots from the top inside of the box. The alignment arm has an engagement finger that engages the top of the carrier and a retaining portion that extends in front of the open side of the carrier. As the wafer carrier with the box door is raised into the box the finger engages the top of the carrier to swing the retaining portion in front of the open side of the carrier to hold the wafers in place. The alignment arm swings by way of a flexible portion eliminating scraping or rubbing of pans.

An object and advantage of the invention is that it provides for latching of the box to the box door with a minimal amount of rubbing or scraping.

An object and advantage of the invention is that an alignment arm for aligning and retaining articles in the carrier is provided that pivots and swings substantially without scraping or rubbing.

An object and advantage of the invention is that the cam pins and the cam surfaces are substantially enclosed to minimize the release of contaminants and particles from said engagement.

A further object and advantage of the invention is that the alignment arm further secures the wafer carrier in place by providing a downward pressure on the top of the wafer carrier.

DETAILED DESCRIPTION OF THE PREFERRED EMBODIMENT

Figure 1:
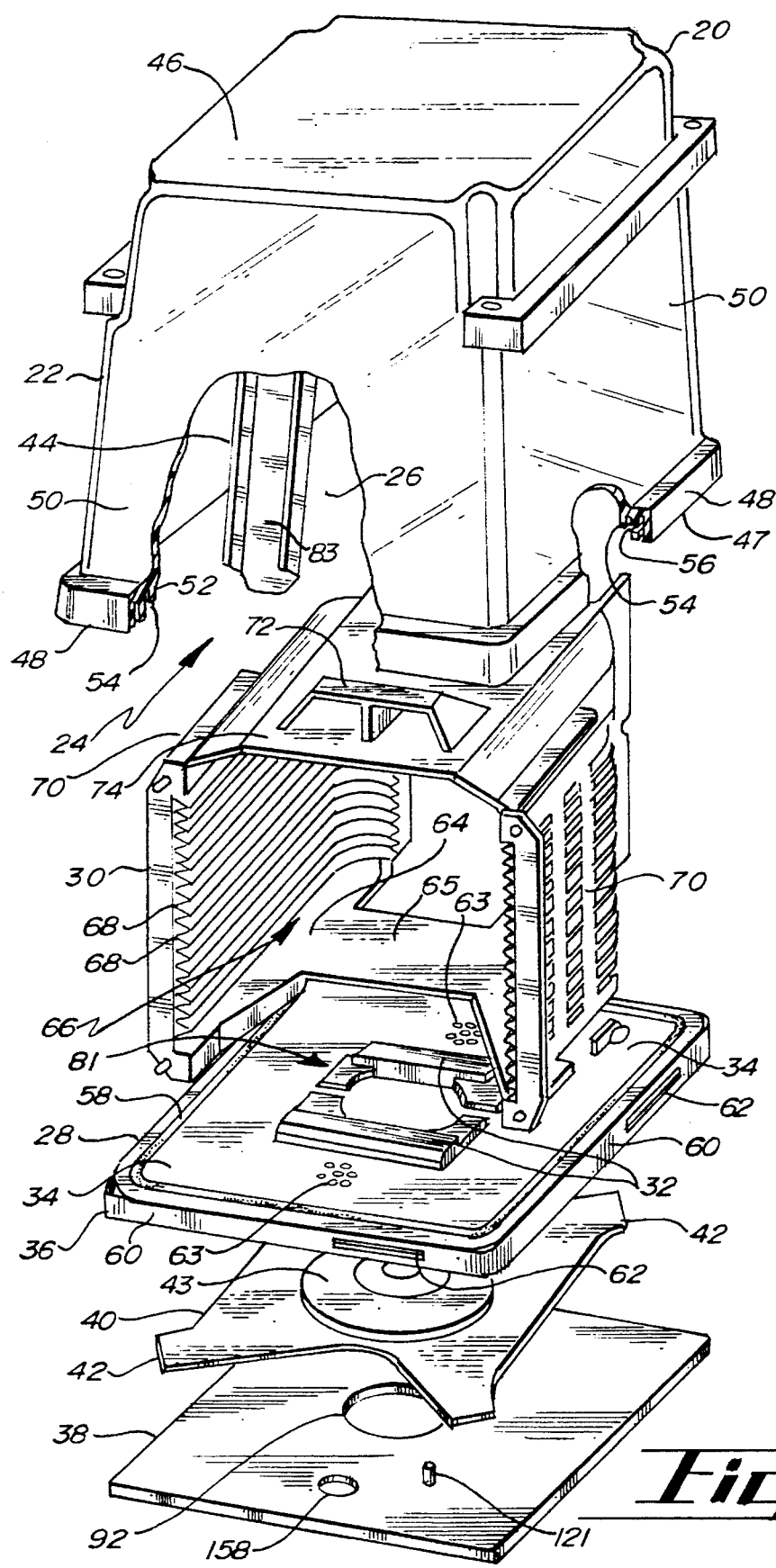
FIG. 1 shows an exploded perspective view of the SMIF pod with portions of the box broken away.

In FIG. 1 an exploded view of the standardized mechanical interface pod is shown and is generally designated by the numeral 20. The pod is generally a container and principally includes a box 22 with an open end 24 and an open interior 26, a box door 28 that sealingly closes the open end 24, and a wafer carrier 30 that seats within protrusions 32 extending from the top surface 34 of the box door 28. The box door 28 has a housing 36 with a bottom plate 38 enclosing a plate configured as a star wheel 40. The star wheel 40 has latching tips 42 and embraces a cammed hub 43. Portions of the box 22 are broken away in FIG. 1 to reveal the alignment arm 44 extending downwardly in the box 22. The box 22 has a top panel 46, a periphery 47 with a bottom flange 48, and four side panels 50. The box portions broken away also reveal a downwardly extending lip 52 with a sealing surface 54 and an inwardly facing recess configured as flange slots 56 in the preferred embodiment.

The box door 28 has a sealing surface 58 within the top surface 34 of the box door 28. The sealing surface 58 is configured to engage and cooperate with the sealing surface 54 of the lip 52. The box door 28 has four sidewalls 60 each of which has a slot 62 positioned to align with the flange slots 56 on the flange 48 when assembled. The box door 28 has vent holes 63 extending to the top surface 34.

The wafer carrier 30 has a lower H-shaped portion 64 with a cross-bar 65 that seats within the protrusions 32 on the top surface 34 of the box door 28. Wafers, not shown, slide into and out of the open front 66 of the wafer carrier 30. The wafers are supported by the support lips 68 integral with the sides 70 of the carrier 30. A handle 72 attaches to the top 74 of the carrier 30.

Figure 2:
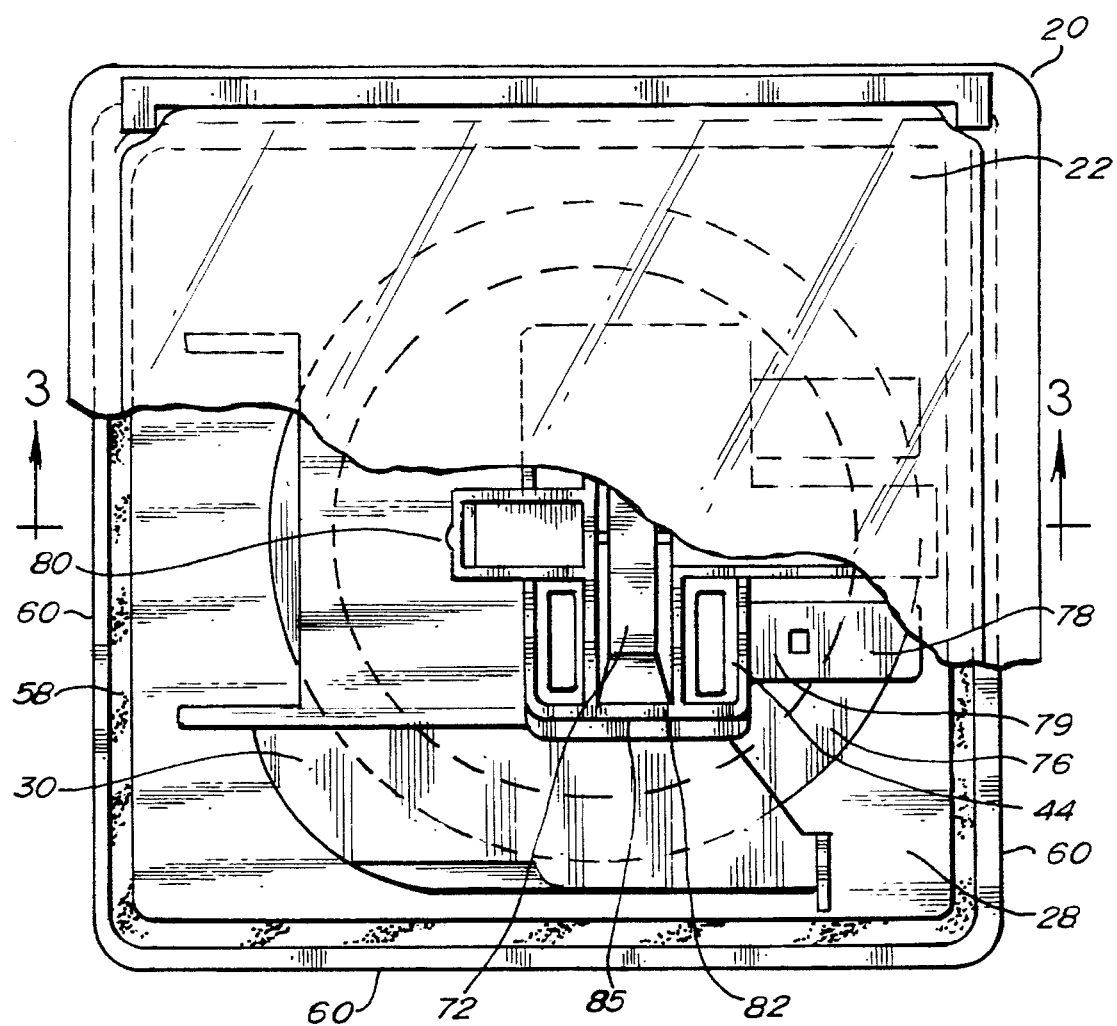
FIG. 2 shows a top plan view of the SMIF pod with the box broken away to reveal the wafer carrier in place on the box door and portions of the alignment arm that attaches to the inside top of the box.
Figure 11:
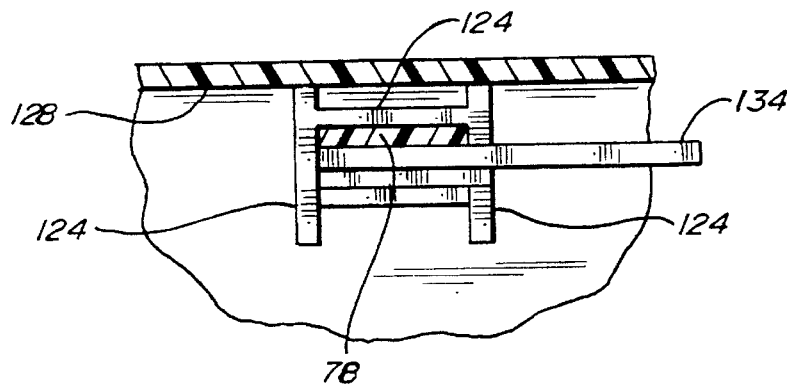
FIG. 11 is a sectional view taken at line 11—11 of FIG. 10.

Referring to FIG. 2, the SMIF pod 20 is shown from a top view with a portion of the box 22 broken away revealing the wafer carrier 30 with a disk 76 in place and also revealing the alignment arm 44. The alignment arm 44 has two support arms 78.

The support arms 78 connect the alignment arm 44 to the box 22 as described in detail below. Each support arm has a resilient flexible portion 79 whereby the alignment arm 44 is pivotally swingable. The alignment arm 44 has a first end 44.1 and a second end 44.2 extending from the support arms 78. A finger 80 extends downward from the first end 44.1 to contact the top 74 of the carrier 30 when the pod 20 is assembled. A rectangular opening 82 in the mid-portion 85 of the arm 44 is sized for the handle 72 on the top 74 of the carrier 30 and allows the alignment arm 44 to swing freely without interference from said handle 72.

Figure 3:
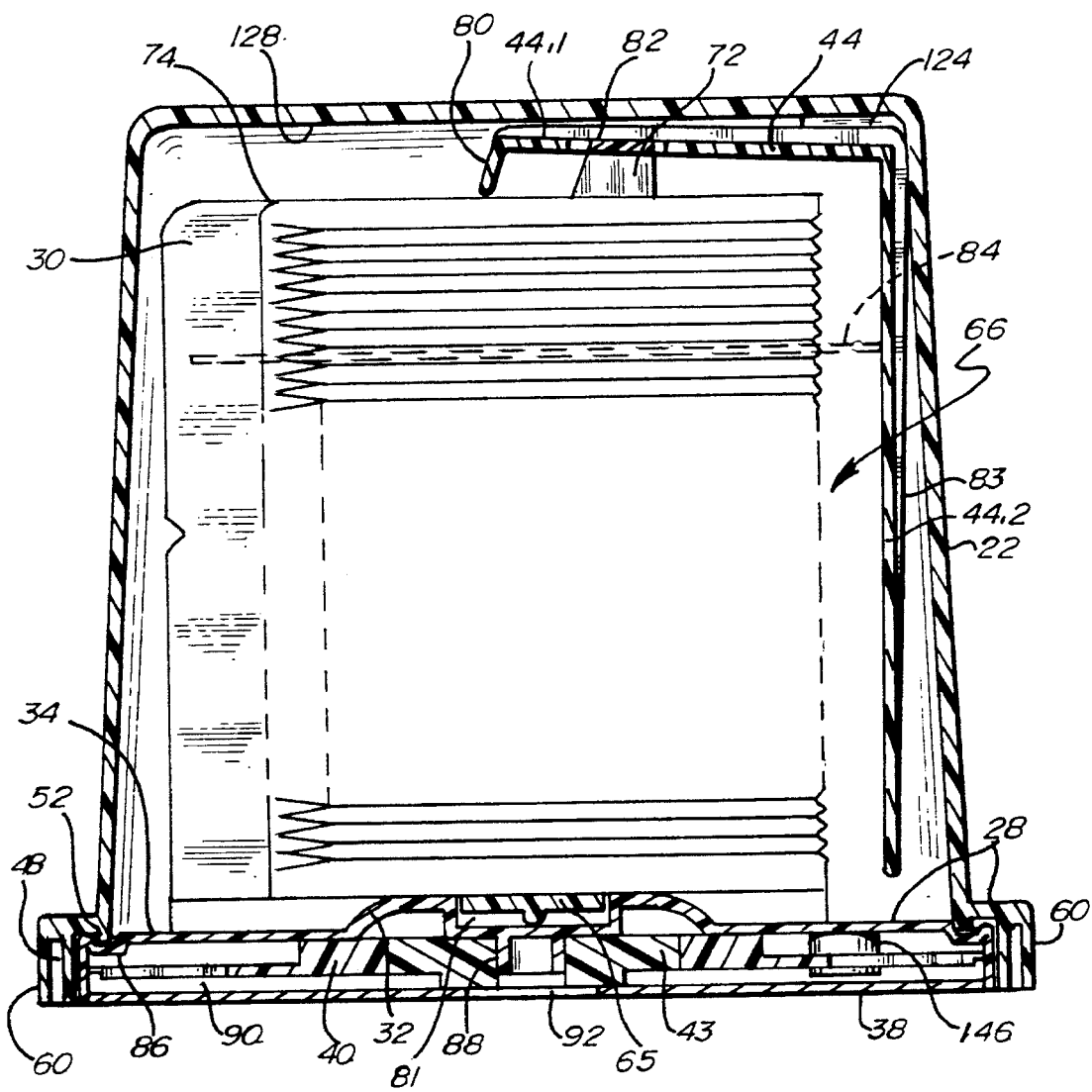
FIG. 3 is a sectional view taken at line 3—3 of FIG. 2.

FIG. 3 shows a cross-sectional view of the SMIF pod 20 with the box door 28 seated and locked in place in the box 22. The carrier 30 is seated on the top surface 34 of the box door 28 with the cross-bar 65 retained and seated between the protrusions 32. The protrusions 32 define a wafer carrier seat or receiving region 81. The alignment arm 44 is shown with the finger 80 in contact with the top 74 of the wafer carrier 30 and a retaining arm portion 83 on the second end 44.2 extending downward in front of the open front 66 of the carrier 30 to retain any wafers in place in the carrier 30. The positioning of a wafer 84 is shown by phantom lines. The box 22 may be suitably molded of a clear polycarbonate plastic. The box door 28 may be molded of a polycarbonate with carbon fiber filler. The carbon fiber filler makes the polycarbonate electrically conductive and thus static dissipative. This feature minimizes the buildup of a static charge on the wafers, disks, and/or carrier. Static charges are highly undesirable in that charged objects may attract particles causing contamination of the pieces being processed. A suitable polycarbonate with carbon filler is the ESD 380series of resins available from the RTP Co., Winona, Minn.

FIG. 3 also shows the engagement of the box 22 with the box door 28. The box door 28 substantially fits within the bottom flange 48 of the box 22 with the lip 52 engaged with a groove or recess 86 on the top surface 34 of the box door 28. The star wheel 40 is shown embracing the cammed hub 43 which is rotatably mounted on a post 88 attached to the box door 28. Two of the latching tips 42 of the star wheel 40 are shown extended into the bottom flange 48 of the box 22. The bottom plate 38 seats within the bottom flange 48 of the box door 28 enclosing the interior 90 of the box door 28. The bottom plate 38 has an opening 92 for accessing and rotating the cammed hub 43. The bottom plate 38 is secured to the box door 28 by screws or other suitable means and may suitably be a polycarbonate plastic.

Figure 4:
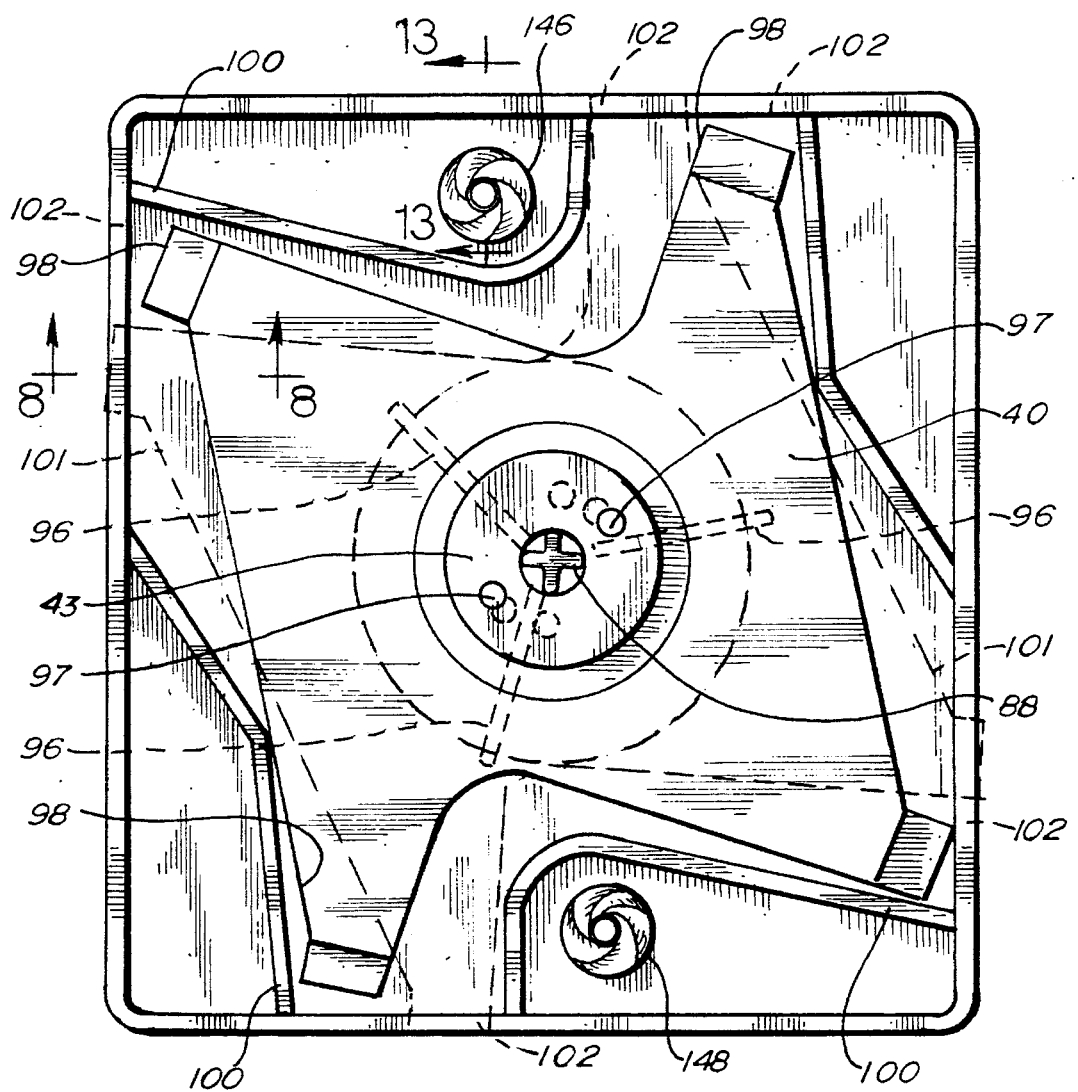
FIG. 4 is a bottom view of the box door with the bottom plate removed revealing the star wheel, the cammed hub, and the one-way valves.

Referring to FIG. 4, a bottom view of the box door 28 is shown with the bottom plate 38 removed. The two principal positions of the star wheel 40 are shown with the phantom lines showing the extended position and designated by the numeral 101. The star wheel 40 and the cammed hub 43 are concentrically arranged with cam followers configured as cam pins 96 extending radially inwardly from the star wheel 40 to engage with cam surfaces (not shown in this view) on the cammed hub 43. The cammed hub 43 is rotatable on the post 88 with the rotation limited by the cam pins 96 shown extending radially from star wheel 40. The star wheel 40 partially rotates on the hub 43 to the extent permitted by the contact of the star wheel periphery 98 with the interior walls 100 of the box door 28 or the slot ends 102. The cammed hub has engagement holes 97 for engaging and rotating the hub by the processing equipment or by manual means. The star wheel 40 may be formed from a polycarbonate plastic. The cammed hub may be formed from an acetal plastic such as Delrin® manufactured by E. I. DuPont de Nemours & Company, Inc. The cam pins 96 are suitably of stainless steel and may be press fit into the star wheel 40.

Figure 5:
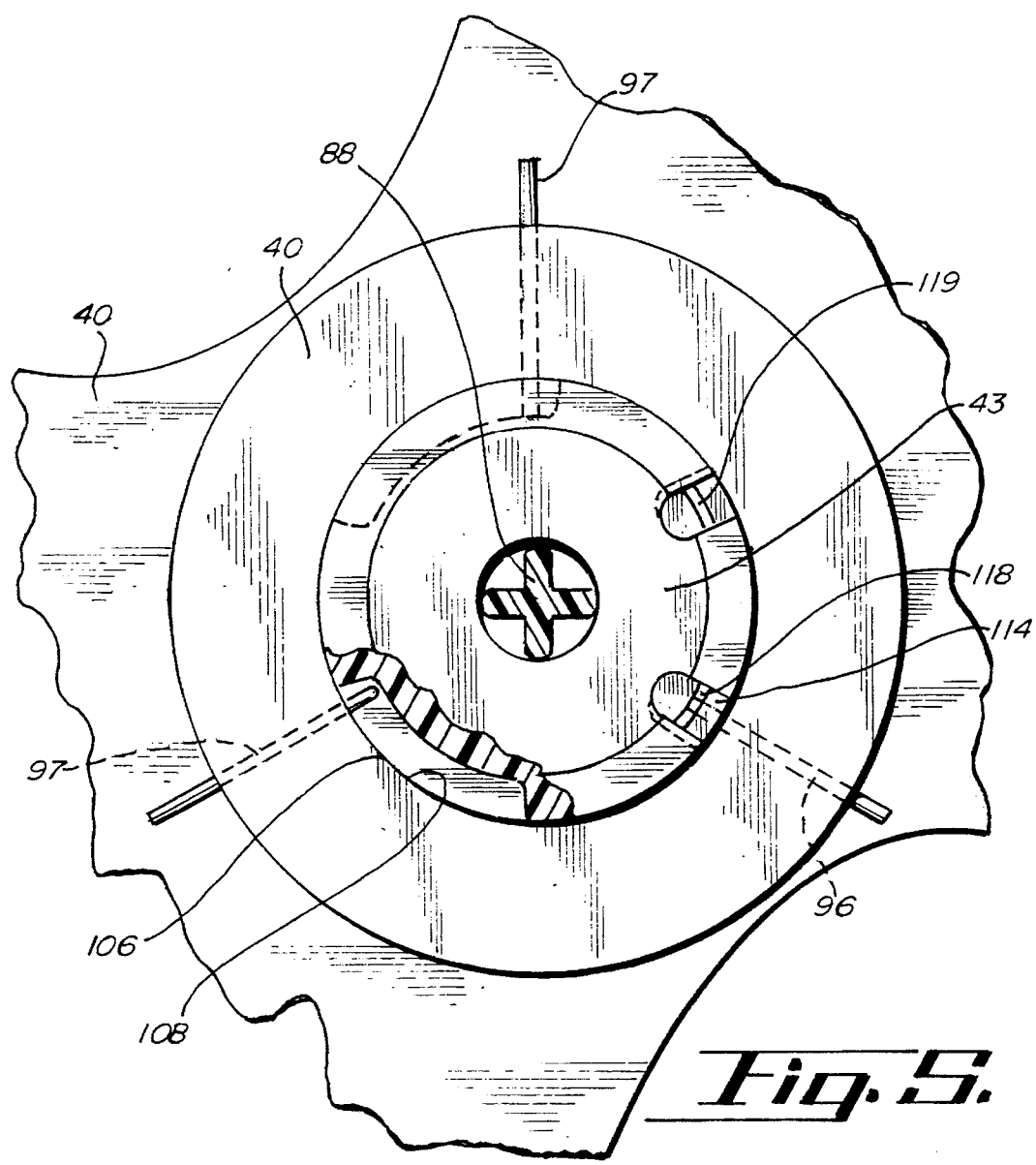
FIG. 5 is a plan view of the cammed hub in place in the star wheel showing the cam follower pins and the cam surfaces.
Figure 6:
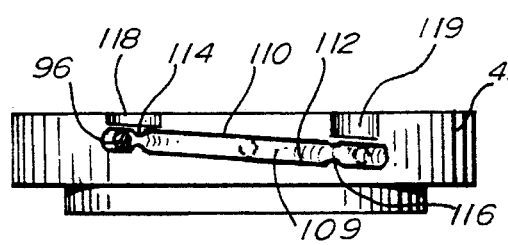
FIG. 6 is an elevational view of the cammed hub showing cam surfaces.
Figure 7:
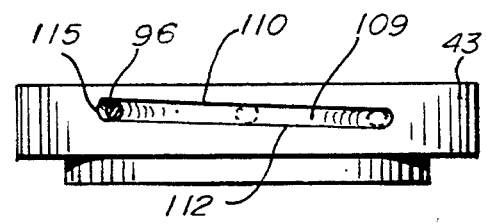
FIG. 7 is an elevation of the side of the cammed hub showing the cam surface with detents.

Referring to FIGS. 5, 6, and 7, the cammed hub 43 is shown in detail. FIG. 5 is a top view showing a portion of the star wheel 40 with the cammed hub 43 in place and a portion of the cammed hub 43 cut away. The star wheel 40 and cammed hub 43 contact and rotate with respect to each other at the inner surface 106 of the star wheel 40 and the outer periphery 108 of the cammed hub 43. FIG. 6 shows the exterior of the cammed hub 43 with a groove 109 forming upper 110 and lower 112 cam surfaces, an upper detent 114, and a lower detent 116. A cam pin 96 is shown in place at the upper detent 114. FIG. 7 shows a side of the cammed hub 43 with a groove 109 having an upper cam surface 110 and a lower cam surface 112, an upper cam position 115 and a lower cam position 117. The grooves 109 with the cam surfaces 110, 112 may be formed by cutting the grooves 109 radially inward from the outer periphery 108 of the cammed hub 43. The detents 114, 116, as shown, may be formed by removal of material to form notches 118, 119 that approach the groove but leave a suitable bridge of material to provide a resilient portion comprising the detents 114, 116.

Figure 8A:
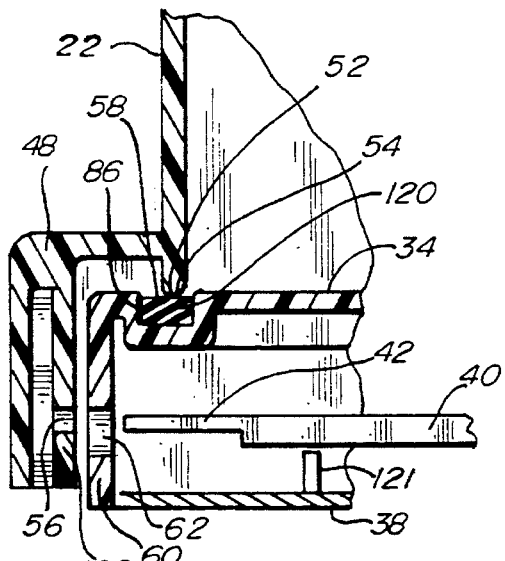
FIG. 8a is a sectional elevation showing the portion of the box in place on the box door in an unlatched mode.
Figure 8B:
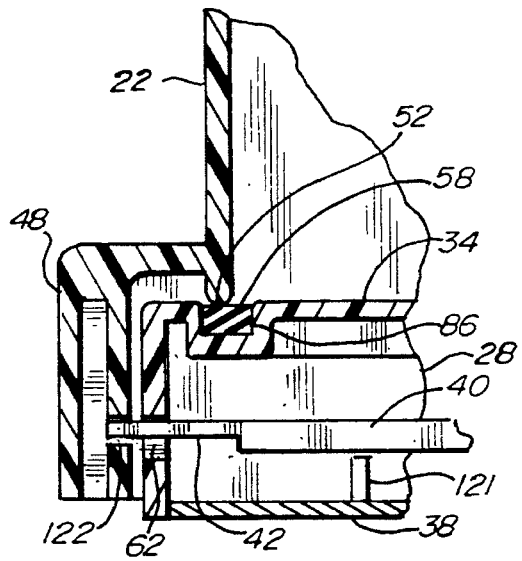
FIG. 8b shows the view of FIG. 8a with the star wheel latching tips inserted into the slot in the interior sidewall of the box.
Figure 8C:
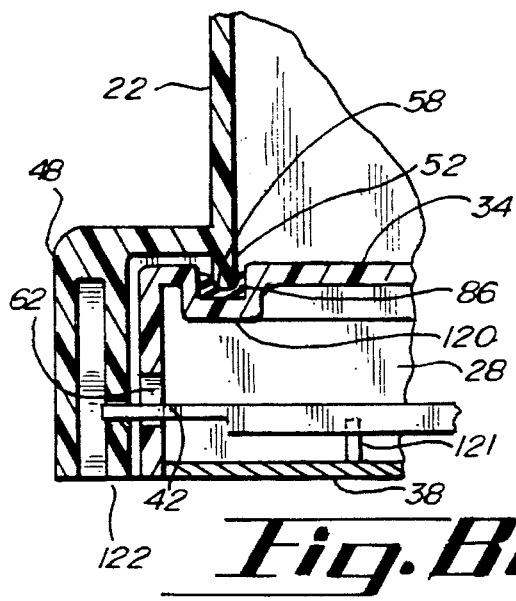
FIG. 8c shows the same view as FIGS. 8a and 8b with the star wheel and latching tips moved vertically downward to sealingly engage the box with the box door.

FIGS. 8a, 8b, and 8c show a cross-section of the bottom flange 48 of the box 22, a latching tip 42 of the star wheel 40, the outer wall 60 of the box door 28, and the cooperating sealing surfaces 54, 58. The groove or recess 86 in the top surface 34 of the box door 28 has an elastomeric material 120 in place with the upward facing surface of the material 120 forming the sealing surface 58 that engages and seals with the sealing surface 54 of the lip 52. A stop post 121 extends from the bottom plate 38 upwardly to interfere with the rotation of the star wheel 40 depending upon the relative vertical position of the star wheel 40. FIG. 8a shows the relationship of the box 22 to the box door 28 such as when the box door 28 is first raised to engage the box 20. The latching tip 42 is totally retracted within the box door 28 and the sealing surface 54 of the lip 52 is contacting but not compressing the elastomeric material 120.

FIG. 8b shows the box 22 and box door 28 in the same respective positions to each other as FIG. 8a but has the latching tip 42 extending outwardly through the slot 62 into the slots 56 in the flange 48. As shown in this view, the latching tip 42 is above or over the latching surface 122 of the recess 86 and preferably is not contacting said latching surface 122. The extension of the latching tips 42 into the slots 56 without contact with the slots eliminates scraping and the generation of particles.

FIG. 8c shows the latching tip 42 engaged with the latching surface and the latching tip 42 engaged with the latching surface 122. The star wheel 40 is in a relatively lower position with respect to the box door 28 and slot 62. The tip 42 is compressing the elastomeric material 120 forming a seal. The stop post 123 as shown in this view interferes with the clockwise (looking upward) rotation of the star wheel 40.

Referring to FIGS. 9, 10, 11, and 12, details of the alignment arm 44 and a suitable means for attaching the alignment arm 44 to the box 22 are shown. To secure the alignment arm 44 to the box 22, two corner brackets 124 and two wedges 126 are utilized whereby the alignment arm 44 may swing without rubbing or scraping of components. The FIG. 12 perspective view shows the principal components utilized in an exploded view. The brackets 124 have apertures 125 sized to receive the wedge 126 and the support arms 78. Inclined nubs 130 extending from the wedges 126 snap into place in openings 132 in the support arms 78 to prevent longitudinal movement of the support arms 78 with respect to the wedges 126. Stop tabs 134 on the wedges 126 prevent longitudinal movement of the wedges 126 out of the bracket aperture 125.

Figure 13:
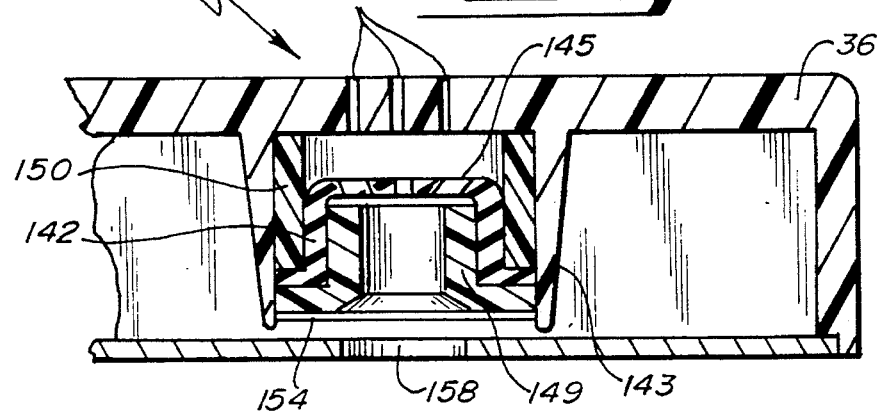
FIG. 13 is a cross-section taken at plane 13—13 of FIG. 4 showing a purge valve.
Figure 14:
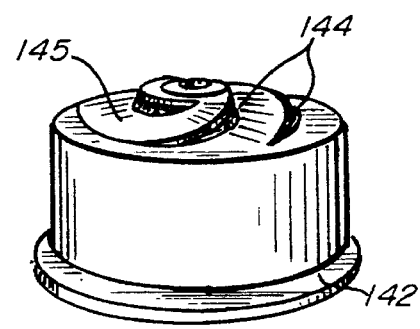
FIG. 14 is a perspective view of the one-way valve spiral diaphragm utilized for purging the SMIF pod in an extended or "open" mode.
Figure 9:
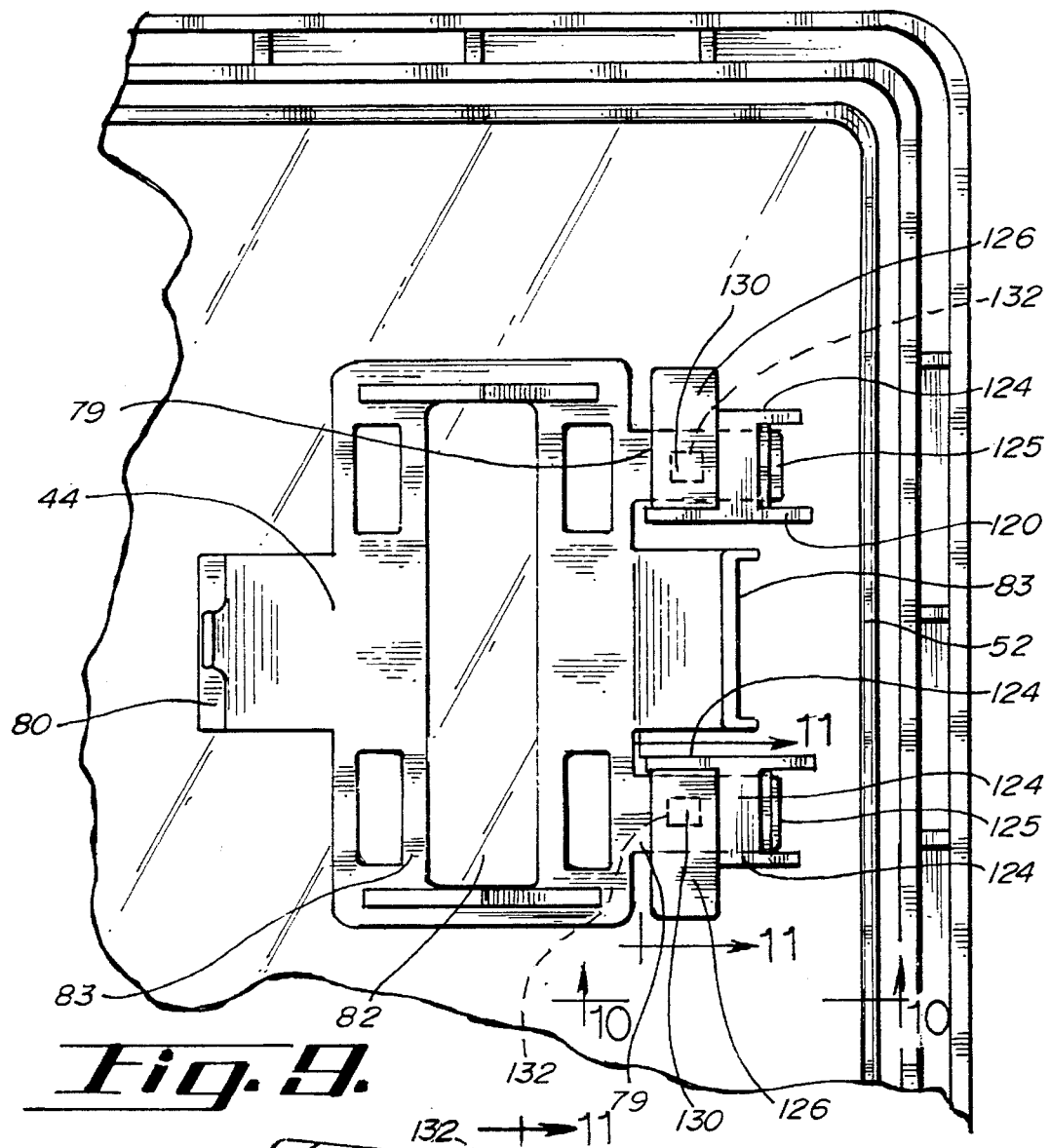
FIG. 9 shows a bottom view of a portion of the inside of the box revealing the retainer arm and its attachment to the box.

FIGS. 13 and 14 show details of the purging system utilized for purging the pod 20 with nitrogen or other gas. The principal component utilized in the preferred embodiment is shown in perspective in FIG. 14 and is a one-way diaphragm valve 142 formed of elastically deformable material such as plastic or metal. FIG. 13 shows a cross-sectional view of a valve configuration with a diaphragm valve suitably situated in a valve housing 143. Two such valve configurations are utilized for purging the interior of the pod 22 as shown in FIG. 4. One for the inlet of the gas and the other for outlet of the gas inside the pod. Angularly cut spiral slits 144 in the diaphragm 145 allow the diaphragm 145 to extend axially in only one direction. Such valves are available from Dab-O-Magic Corp., 896 South Columbus Ave., Mount Vernon, N.Y. 10660. Female receptacles 149 are configured to receive nipples (not shown) such as from the processing equipment with which the pods 20 interface. The one-way valves 142 may be retained within the valve housing 143 by a suitable bushing 150 and snap ring 154 as depicted.

Vent holes 63 extending through the box door 28 connect the open interior 26 of the box 22 to the one-way valves 142. Access holes 158 in the bottom plate 38 allow access to the female receptacles 149. The diaphragm 145 of the inlet valve 148 of FIG. 14 may be opened by the nipple extending the diaphragm outwardly.

Figure 12:
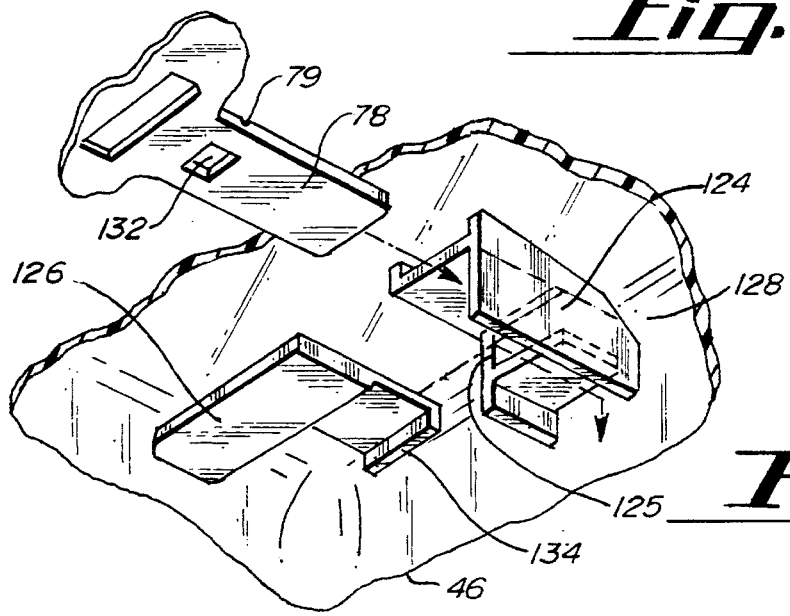
FIG. 12 is an exploded view of the wedge, the support arm, and bracket for attaching an alignment arm to the box.
Figure 10:
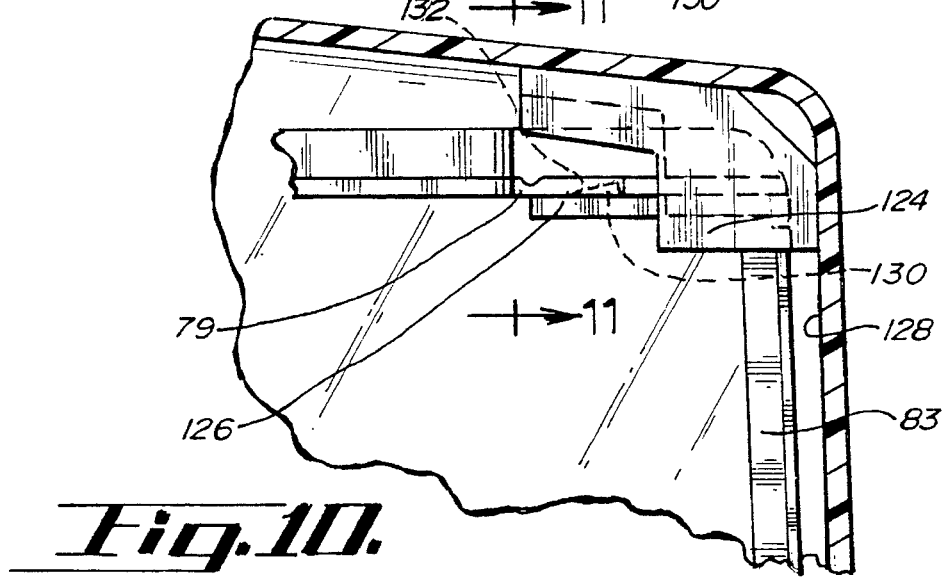
FIG. 10 is a sectional view taken at line 10—10 of FIG. 9.

The SMIF pod 20 operates as follows: Referring to FIGS. 1 and 3, with the box 22 removed from the box door 28, wafers may be inserted into the carrier 30 for processing, transporting, or storage. The wafer carrier 30 is appropriately seated on the top surface 34 of the carrier 30 as guided by the protrusions 32. The box 22 is then lowered into position, or the box door 28 is raised, whereby the box door 28 closes the open end 24 of the box 22. As the inside surface 128 of the top of the box 22 approaches the wafer carrier 30 the alignment arm finger 80 contacts the top 74 of the wafer carrier 30 and causes the alignment arm 44 to pivot at the resilient, flexible portion 79 (see FIG. 20) swinging the retaining arm portion 83 towards the open front 66 of the wafer carrier 30 to engage the edges of any wafers in place in the wafer carrier 30. The alignment arm 44 pivoting at the flexible portions 79 of the support arms results in a swinging or pivoting motion without any scraping or rubbing of parts. As best shown in FIGS. 10 and 12, the flexible portion may be formed by removal of material to form a groove or recess across the support arms 78. The retaining arm portion 83 is configured to align vertically to retain all of the wafers in said wafer carrier 30.

With the latching tips 42 in their fully retracted position as depicted in FIGS. 8A and 4, the cam pin 96, shown in FIG. 7, is at the higher end position of the groove and is secured by the upper detent 114, see FIG. 6. At this position the relationship of the box 22 to the box door 28 is as shown in FIG. 8a with the lip 52 contacting but not substantially compressing the elastomeric material 120. Rotation of the cammed hub 43 by external means, such as associated processing equipment (not shown), in a counterclockwise direction (looking upward) also rotates the star wheel 40 with the cammed hub 43 in that the upper detent 114 holds the cam pin 96 in place. The only resistance to the rotation of the star wheel 40 is the friction between the star wheel 40 and the post 88 and/or housing 36. This friction is nominal and is not sufficient to release the cam pin 96 from the upper detent 114. The rotation of the star wheel 40 moves the latching tips 42 from the retracted position to the fully extended position as indicated by the numeral 102 in FIG. 4. At the fully extended position further rotation of the star wheel 40 is stopped by interference with the interior walls 100 of the box 22, by a suitably placed stop, or by the sides of the slots 62. Continued rotation of the cammed hub 43 in the clockwise direction then releases the cam pin 96 from the upper detent 114 and directs the cam pins 96 along the cam surfaces 110, 112 toward the lower detent 116. This movement of the cam pin 96 in a generally downward direction with respect to the cammed hub 43 results in a relative lowering of the star wheel 40 and correspondingly the latching tips 42. As the star wheel 40 and latching tips 42 are being lowered relative to the box door 28, the latching tips 42 contact the latching surface 122 in the slot 56 of the box 22 as shown in FIG. 8b.

Continued counterclockwise rotation of the cammed hub 43 directs a downward force on the latching surface 122 of the slot 56 of the box 22 to move the box 22 in a downward direction with respect to the box door 28 which correspondingly depresses the elastomeric material 120 in the recesses 86 forming a seal between the lip 52 and the sealing surface. The counterclockwise rotation may be continued until the cam pin 96 passes the lower detent 116 at which point the detent 116 locks the cammed hub 43 with respect to the star wheel 40 and thus the latching tips 42 in the fully outward and fully downwardly extended position as shown in FIG. 8c. In this locked position the pod 20 may be transported in that the box 22 is secured to the box door 28 and the alignment arm 44 secures the wafer carrier 30 in place and further retains any wafers in the carrier 30.

To release the box 22 from the box door 28, the cammed hub 43 is rotated in a clockwise direction by manual or by automated means such as by the processing equipment. The post 121 extending partially towards the box door 28 from the bottom plate 38 prevents the star wheel 40 from immediately rotating with the clockwise rotation of the cammed hub 43. Rather, the cam pins 96 follow the cam surfaces 110, 112 to raise the star wheel 40 and latching tips 42 with respect to the box door 28. The raising of the star wheel 40 continues until the star wheel 40 clears the post 121 extending from the bottom plate 38. The latching tips 42, star wheel 40, the post 121, and cam surfaces 110, 112 are so configured that the star wheel 40 with latching tips 42 will continue to be raised until the elastomeric material 120 is substantially decompressed and the position of the box 22 with respect to the box door 28 is substantially as shown in FIG. 8b. At this point the continued rotation of the cammed hub 43 in a clockwise direction will also rotate the star wheel 40 from the extended position 102 to the fully retracted position as shown in FIGS. 4 and 8a.

Typically, the pod 20 with the box door 28 latched and sealed to the box 22 will be placed on the exterior of a piece of processing equipment. The flange 48 of the box 22 will be latched and sealed to the processing equipment and the cammed hub 43 will be engaged and rotated by the processing equipment. The box door 28 with the wafer carrier 30 and wafers in place will be lowered by automated means into the processing equipment with the box 22 remaining sealed on the exterior of the processing equipment. The wafers may then be processed and, after processing, returned to and again sealed within the box 22.

The interior 26 may be purged, such as when the pod 20 is first latched to the processing equipment in order to minimize the presence of contaminants. Nipples (not shown) from the processing equipment may be extended into the female receptacles 149 to extend the diaphragms 145 and open the valves 146, 148. Gas such as nitrogen may then be injected into the one-way valve 148, shown in FIG. 4, and the original gas in the open interior 26 is purged out of the one-way outlet valve 146.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention. For example, the cam surfaces may be positioned on the star wheel and the cam pins or other configuration of cam followers may be fixed to the cam hub or the box door housing.

Although the box and pod are depicted as roughly cubical, it is understood that any of a variety of shapes would be suitable, such as cylindrical.

What is claimed:

1. A transportable container for sealingly enclosing articles in a substantially particle free environment and for interfacing with processing equipment, the container comprising:

(a) a box having an open interior, an open end, and a plurality of inwardly facing recesses adjacent to the open end;

(b) a removable box door closing the open end, the box door having a housing, the housing having a plurality of sidewalls, the sidewalls having a plurality of slots positioned to be adjacent to the recesses in the box, the housing having an open interior; and, (c) a plate rotatably mounted in the open interior of the box door housing, the plate having a plurality of latching tips peripherally located on the plate, the plate configured such that each tip is positioned at a slot and such that as the plate is rotated the tips rotate outwardly through the slots and into the recesses in the box.

2. The transportable container of claim 1, wherein the plate has an extended position defined by the tips extending outwardly through the slots and a retracted position defined when the tips are retracted within the slots and wherein the container further comprises a means for raising and lowering the latching tips when the plate is in the extended position.

3. The container of claim 2, wherein the means for raising and lowering the latching tips comprise a cam surface and a cam follower, the cam follower connected to the plate and the cam surface coupled to the box door.

4. The container of claim 2, wherein the means for raising and lowering the latching tips comprise a cam surface and a cam follower, the cam surface located on the plate and the cam follower coupled to the box door.

5. The container of claim 1, further comprising a cammed hub and a cam follower, the cammed hub rotatably mounted in the interior of the box door and embraced by the plate, the cammed hub having a .cam surface, the cam follower fixed to the plate and engaging the cam surface, and wherein the plate is rotatable and vertically moveable with respect to the cammed hub.

6. The container of claim 5 further comprising a detent positioned on the cam surface for locking the plate in position.

7. The container of claim 1, wherein the box door further includes a top surface, and wherein the container further comprises a wafer carrier that seats on the top surface of the box door and has an open side for receiving wafers.

8. The container of claim 7, wherein the container further comprises an alignment arm, the alignment arm having a first end and a second end, a finger on the first end of the alignment arm, a wafer retaining a portion on the second end of the alignment arm, the alignment arm swingably attached to the box intermediate the two ends whereby as the box door with the wafer carrier is received by the box, the finger engages the wafer carder and swings the alignment bar into an alignment and retaining position.

9. The container of claim 8, wherein the alignment arm comprises a resilient portion by which the alignment arm swings and whereby the alignment arm is biased away from the alignment and retaining position.

10. The container of claim 1, wherein the box door is formed from a static dissipative material.

11. The container of claim 1 further comprising two valves positioned in the box door for purging the open interior, the valves comprised of a resilient diaphragm having spiral slits.

12. A transportable container for interfacing with processing equipment and for sealingly enclosing wafers in a substantially particle free environment, the container comprising:

(a) a box, the box having an open interior and an open end;

(b) a box door sized to be received by the box and to close the open end, the box door having a surface facing the interior, the surface having a wafer carrier receiving region;

(c) a wafer carrier, the carrier sized to be received by the receiving region on the interior facing surface of the box door, the carrier having an open side for receiving wafers; and (d) an alignment arm having opposing ends with a finger on one end and a retaining arm portion on the opposing end, the alignment arm swingably attached to the box only intermediate the retaining arm portion and the finger, the retaining arm portion extending across the open end of the box, whereby as the box door with the wafer carrier is received by the box the finger engages the wafer carrier and thereby swings the retaining arm portion into an alignment and retaining position.

13. The container of claim 12, wherein the alignment arm is further comprised of a support arm having a resiliently flexible portion and wherein the support arm is affixed to the box.

14. The container of claim 12, wherein the box door further comprises a plurality of sidewalls with slots and a rotatable plate with latching tips, the plate configured to position the latching tips adjacent the slots whereby partial rotation of the plate extends the latching tips out the slots, and wherein the box has a plurality of recesses positioned to receive the latching tips.

15. The container of claim 14 further comprising a means for raising and lowering the latching tips.

16. The container of claim 15, wherein the means for raising and lowering the latching tips comprises a hub having a cam surface rotatably attached to the box door and a cam follower engaging the cam surface and attached to the plate.

17. The container of claim 16, wherein the cam surface has a detent to lock the cam follower.

18. The container of claim 12, wherein the box door is formed from a static dissipative material.

19. The container of claim 12 further comprising two valves positioned in the box door for purging the open interior, the valves comprised of a resilient diaphragm having spiral slits.

20. A transportable container for interfacing with processing equipment and for sealingly enclosing wafers in a substantially particle free environment, the container comprising:

(a) a box, the box having a sealing surface and an open end with a periphery, the periphery having latching surfaces;

(b) a box door sized to be received by the box and closing the open end, the box door having a sealing surface and sidewalls with elongate openings adjacent to the latching surfaces; and (c) a plate vertically slidable and rotatably mounted within the box door, the plate having a plurality of latching tips located at the periphery of the plate, the tips positioned adjacent to the elongate openings whereby rotation of the plate in alternate directions rotates each tip outwardly and inwardly through the elongate openings, whereby when said tips are rotated outwardly they extend above the latching surfaces.

21. The container of claim 20, further comprising a means for raising and lowering the plate when the tips are positioned over the latching surfaces, whereby lowering the plate engages the latching tips with the latching surfaces and moves the box door sealing surface into a sealing engagement with the box sealing surface.

22. The container of claim 21, further comprising a wafer carrier and wherein the box door has a top surface with a wafer carrier seat sized for receiving the wafer carrier.

23. The container of claim 21, wherein the container further comprises an alignment arm, the alignment arm having a first end and a second end, a finger on the first end of the alignment arm, and a wafer retaining arm portion on the second end of the alignment arm, the alignment arm swingably attached to the box intermediate the two ends whereby as the box door with the wafer carrier is received by the box, the finger engages the wafer carrier and swings the retaining arm portion into an alignment and retaining position.

24. The container of claim 20, wherein the box door has an open interior, a cammed hub rotatably mounted in the open interior of the box door, the cammed hub mounted concentric with the plate, the cammed hub having a cam surface, the plate having a cam follower for engaging the cam surface.

25. The container of claim 20, wherein the box door is formed of a static dissipative material.

\* \* \* \* \*